(12) United States Patent
Wu et al.

(10) Patent No.: US 12,193,175 B2
(45) Date of Patent: Jan. 7, 2025

(54) MULTI-TEMPERATURE CONTROL CABINET AND SCHEDULING METHOD FOR MULTI-TEMPERATURE CONTROL CABINET

(71) Applicant: Huawei Digital Power Technologies Co., Ltd., Shenzhen (CN)

(72) Inventors: Wenxue Wu, Dongguan (CN); Wanxiang Ye, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 277 days.

(21) Appl. No.: 17/711,240

(22) Filed: Apr. 1, 2022

(65) Prior Publication Data

US 2022/0330442 A1 Oct. 13, 2022

(30) Foreign Application Priority Data

Apr. 7, 2021 (CN) .......................... 202110374514.3

(51) Int. Cl.
 *H05K 5/02* (2006.01)
(52) U.S. Cl.
 CPC ......... *H05K 5/0213* (2013.01); *H05K 5/0226* (2013.01)
(58) Field of Classification Search
 CPC ....... H05K 5/0213; H05K 5/0226; H05K 7/20
 See application file for complete search history.

(56) References Cited

U.S. PATENT DOCUMENTS

| 2008/0122993 | A1* | 5/2008 | Nakamichi | H05K 5/0213 348/789 |
| 2010/0018072 | A1* | 1/2010 | Kim | D06F 58/203 62/238.7 |
| 2011/0030388 | A1* | 2/2011 | Johansson | F24F 5/0042 62/3.4 |
| 2016/0302326 | A1* | 10/2016 | Chen | H05K 7/20609 |
| 2019/0198834 | A1* | 6/2019 | Maloney | H04Q 1/14 |

(Continued)

FOREIGN PATENT DOCUMENTS

| CN | 101827506 A | 9/2010 |
| CN | 202350249 U | 7/2012 |
| CN | 103904568 A | 7/2014 |

(Continued)

*Primary Examiner* — Henry T Crenshaw
(74) *Attorney, Agent, or Firm* — Maier & Maier, PLLC

(57) ABSTRACT

The multi-temperature control cabinet includes a cabinet body, a cabinet door, and a refrigerating system. The refrigerating system includes at least one air conditioner, at least one direct ventilation unit, and an environment monitoring apparatus. Both the air conditioner and the direct ventilation unit are disposed on the cabinet door, and the air conditioner and the direct ventilation unit are disposed in parallel in a height direction of the cabinet door. An air guide assembly is disposed between the direct ventilation unit and an air exhaust vent of the air conditioner. The environment monitoring apparatus is connected to both the air conditioner and the direct ventilation unit, and the environment monitoring apparatus is configured to monitor temperature and humidity in the cabinet body, and control turning-on and turning-off of the air conditioner and the direct ventilation unit based on the temperature and the humidity in the cabinet body.

13 Claims, 9 Drawing Sheets

(56) References Cited

U.S. PATENT DOCUMENTS

2020/0214459 A1* 7/2020 Venditto ................ A47C 19/22
2020/0390002 A1   12/2020 Da Silva Weber et al.

FOREIGN PATENT DOCUMENTS

| | | |
|---|---|---|
| CN | 203775582 U | 8/2014 |
| CN | 204539637 U | 8/2015 |
| CN | 106594930 A | 4/2017 |
| CN | 107374075 A | 11/2017 |
| CN | 207284039 U | 4/2018 |
| CN | 108565730 A | 9/2018 |
| CN | 208227564 U | 12/2018 |
| CN | 208580995 U | 3/2019 |
| CN | 113301771 A | 8/2021 |
| EP | 1367331 * | 12/2003 |
| EP | 1367331 A1 | 12/2003 |
| EP | 3758175 A1 | 12/2020 |
| WO | 2020261794 A1 | 12/2020 |

* cited by examiner

MULTI-TEMPERATURE CONTROL CABINET AND SCHEDULING METHOD FOR MULTI-TEMPERATURE CONTROL CABINET

CROSS-REFERENCE TO RELATED APPLICATION

This application claims priority to Chinese Patent Application No. 202110374514.3, filed on Apr. 7, 2021, which is hereby incorporated by reference in its entirety.

TECHNICAL FIELD

The embodiments are related to the field of cabinet technologies, and in particular, to a multi-temperature control cabinet and a scheduling method for a multi-temperature control cabinet.

BACKGROUND

A cabinet is a freestanding or self-supporting housing that accommodates electrical or electronic equipment. A door, a removable or non-removable side panel, and a backplane are usually configured for the cabinet. The cabinet is an indispensable component of electrical equipment and is a carrier of electrical control equipment. The cabinet is usually made of a cold-rolled steel plate or an alloy, and can provide protection functions such as waterproof, dustproof, and electromagnetic interference prevention for a stored device. In addition, to ensure that the device in the cabinet can run in a good environment, a temperature adjustment system is disposed in the cabinet to ensure that the device in the cabinet can run in a stable environment.

In the conventional technology, an air conditioner and direct ventilation are disposed in a cabinet to adjust temperature in the cabinet. Both the air conditioner and the direct ventilation are connected to a temperature control component. The temperature control component is configured to: monitor the temperature in the cabinet, and control turning-on and turning-off of the air conditioner and the direct ventilation by using the temperature in the cabinet. When the temperature in the cabinet is relatively high, the air conditioner starts to run, and the direct ventilation does not run; or when the temperature in the cabinet is relatively low, the air conditioner is turned off, and the direct ventilation starts to work, to adjust the temperature in the cabinet.

However, the controlling the turning-on and the turning-off of the air conditioner and the direct ventilation by using the temperature control component causes fluctuation of humidity in the cabinet, and in a serious case, causes a high-humidity alarm and condensation of a device in the cabinet.

SUMMARY

Embodiments provide a multi-temperature control cabinet and a scheduling method for a multi-temperature control cabinet, to resolve condensation caused due to fluctuation of humidity in the cabinet.

A first aspect of embodiments provides a multi-temperature control cabinet, including a cabinet body, a cabinet door, and a refrigerating system.

The refrigerating system includes at least one air conditioner, at least one direct ventilation unit, and an environment monitoring apparatus.

Both the air conditioner and the direct ventilation unit are disposed on the cabinet door, and the air conditioner and the direct ventilation unit are disposed in parallel in a height direction of the cabinet door.

An air guide assembly is disposed between the direct ventilation unit and an air exhaust vent of the air conditioner.

The environment monitoring apparatus is connected to both the air conditioner and the direct ventilation unit, and the environment monitoring apparatus is configured to: monitor temperature and humidity in the cabinet body, and control turning-on and turning-off of the air conditioner and the direct ventilation unit based on the temperature and the humidity in the cabinet body.

According to the multi-temperature control cabinet provided in this embodiment, the air conditioner, the direct ventilation unit, and the environment monitoring apparatus are disposed, and the turning-on and the turning-off of the air conditioner and the direct ventilation unit are jointly controlled by using the temperature and the humidity that are monitored by the environment monitoring apparatus. Therefore, ranges of the humidity and the temperature inside the cabinet can be accurately controlled, so that condensation caused when the cabinet door is opened can be alleviated and frequent high-humidity or low-humidity alarms in the cabinet can be reduced, thereby reducing site maintenance frequency and reducing maintenance costs.

As an explanation, when the humidity in the cabinet is excessively high, a device inside the cabinet is corroded, and condensation is likely to be caused when the door is opened; or when the humidity in the cabinet is excessively low, static electricity is likely to be caused, and the device in the cabinet is damaged due to electrostatic discharge, affecting normal running of the cabinet. However, when the air conditioner is used to adjust the temperature in the cabinet, the humidity in the cabinet fluctuates. In this way, frequent high-humidity or low-humidity alarms are caused in the cabinet, and further a risk is brought to normal running of the cabinet. Therefore, proper humidity is also an important indicator for ensuring normal running of the cabinet.

In a possible implementation, the direct ventilation unit includes an air intake unit and an air exhaust unit.

The air guide assembly is disposed between the air intake unit and the air exhaust vent of the air conditioner.

In a possible implementation, there is one cabinet door.

The air intake unit is located below the air conditioner.

The air exhaust unit is disposed above the air conditioner.

In a possible implementation, the cabinet door includes a first cabinet door and a second cabinet door that are oppositely disposed.

One air conditioner and the air intake unit are disposed on the first cabinet door, and the air intake unit is located below the air conditioner.

One air conditioner and the air exhaust unit are disposed on the second cabinet door, and the air exhaust unit is located above the air conditioner.

The air guide assembly is disposed between an air exhaust vent of the air conditioner and the air intake unit on the first cabinet door.

In a possible implementation, an air intake vent, an air mixing channel, and a mixed-air exhaust vent are disposed on the air guide assembly.

The air mixing channel is connected to both the air intake vent and the mixed-air exhaust vent.

The air intake vent is connected to both the air exhaust vent of the air conditioner and the air intake unit.

In a possible implementation, the air guide assembly is of a barrel-like structure.

The air intake vent includes a first air intake vent and a second air intake vent.

The first air intake vent is connected to the air exhaust vent of the air conditioner.

The second air intake vent is connected to the air intake unit.

In a possible implementation, a material of the air guide assembly is sheet metal or plastic.

In a possible implementation, the environment monitoring apparatus includes a temperature monitoring component and a humidity monitoring component.

The temperature monitoring component is configured to monitor the temperature in the cabinet body.

The humidity monitoring component is configured to monitor the humidity in the cabinet body.

A second aspect provides a scheduling method for a multi-temperature control cabinet, used to adjust temperature and humidity in the foregoing multi-temperature control cabinet. The method includes:

performing, by an environment monitoring apparatus, real-time monitoring on temperature and humidity in a cabinet body; and controlling turning-on and turning-off of an air conditioner and a direct ventilation unit based on monitored temperature and humidity values.

In a possible implementation, the controlling turning-on and turning-off of an air conditioner and a direct ventilation unit based on monitored temperature and humidity values includes:

determining whether the temperature monitored by the environment monitoring apparatus is higher than a first preset temperature threshold;

when the temperature monitored by the environment monitoring apparatus is higher than the first preset temperature threshold, turning on the air conditioner;

when the air conditioner is in a working state, determining whether humidity monitored by the environment monitoring apparatus is lower than a first preset humidity threshold; and when the humidity monitored by the environment monitoring apparatus is lower than the first preset humidity threshold, turning on the direct ventilation unit, so that the direct ventilation unit and the air conditioner increase the humidity in the cabinet in an air mixing manner.

In a possible implementation, the controlling turning-on and turning-off of an air conditioner and a direct ventilation unit based on monitored temperature and humidity values includes:

determining whether the temperature monitored by the environment monitoring apparatus is lower than the first preset temperature threshold and higher than a second preset temperature threshold, where the second preset temperature threshold is lower than the first preset temperature threshold; and when the temperature monitored by the environment monitoring apparatus is lower than the first preset temperature threshold and higher than the second preset temperature threshold, turning on the direct ventilation unit, to adjust air in the cabinet by using the direct ventilation unit.

In a possible implementation, after the turning on the direct ventilation unit, the method further includes:

determining whether a difference between humidity monitored by the environment monitoring apparatus in a first preset time period is lower than a first preset difference; and when the difference between the humidity monitored by the environment monitoring apparatus in the first preset time period is lower than the first preset difference, turning off the direct ventilation unit.

In a possible implementation, after the turning on the direct ventilation unit, the method further includes:

determining whether humidity monitored by the environment monitoring apparatus is higher than a second preset humidity threshold, where the first preset humidity threshold is smaller than the second preset humidity threshold; and when the humidity monitored by the environment monitoring apparatus is higher than the second preset humidity threshold, turning off the direct ventilation unit, to decrease the humidity in the cabinet through running of the air conditioner.

In a possible implementation, after the turning off the direct ventilation unit, the method further includes:

determining whether temperature monitored by the environment monitoring apparatus is lower than a second preset temperature threshold, where the second preset temperature threshold is lower than the first preset temperature threshold; and when the temperature monitored by the environment monitoring apparatus is lower than the second preset temperature threshold, turning off the air conditioner;

In a possible implementation, after the turning on the direct ventilation unit, the method further includes:

determining whether humidity monitored by the environment monitoring apparatus is higher than a second preset humidity threshold, where the first preset humidity threshold is smaller than the second preset humidity threshold; and when the humidity monitored by the environment monitoring apparatus is higher than the second preset humidity threshold, turning on an internal circulation fan of the air conditioner, to decrease the humidity in the cabinet in an air mixing manner by using the direct ventilation unit and the air conditioner.

In a possible implementation, after the turning on an internal circulation fan of the air conditioner, the method further includes:

determining whether a difference between humidity monitored by the environment monitoring apparatus in a second preset time period is lower than a second preset difference; and when the difference between the humidity monitored by the environment monitoring apparatus in the second preset time period is lower than the second preset difference, turning off the air conditioner.

DETAILED DESCRIPTION OF THE EMBODIMENTS

Figure 1:
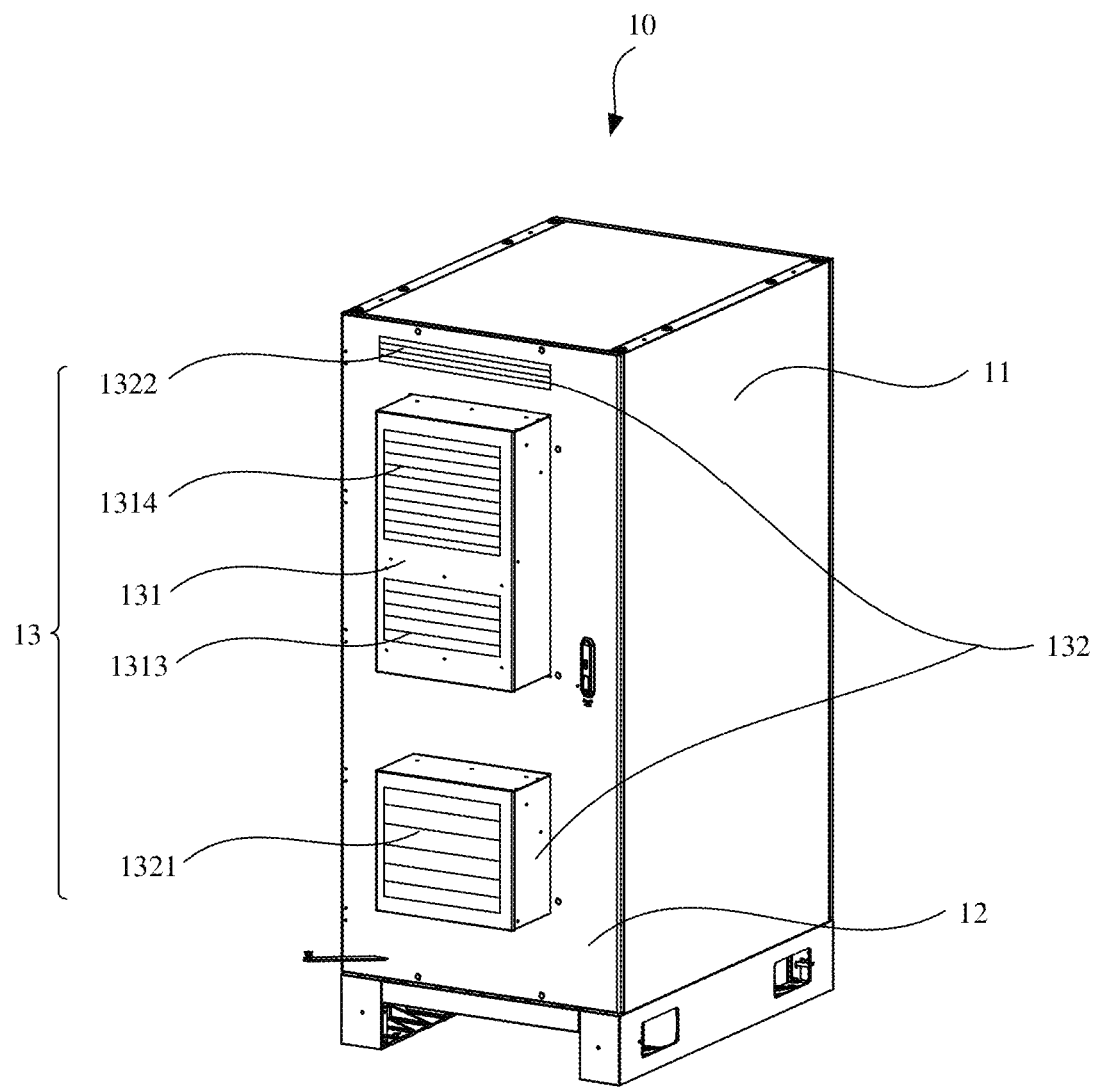
FIG. 1 is a schematic diagram of a three-dimensional structure of a multi-temperature control cabinet according to an embodiment.

An embodiment provides a multi-temperature control cabinet. The multi-temperature control cabinet is used as an outdoor power cabinet, an outdoor device cabinet, an indoor device cabinet, an indoor power cabinet, or the like.

An embodiment provides a multi-temperature control cabinet. The multi-temperature control cabinet can adjust temperature and humidity in the cabinet, so that it can be ensured that a device in the cabinet can normally run in a proper temperature range. In addition, the multi-temperature control cabinet can further adjust the humidity in the cabinet, to resolve fluctuation of the humidity in the cabinet that is caused due to temperature adjustment.

It should be noted that when the humidity in the cabinet is excessively high, the device in the cabinet is corroded; or when the humidity in the cabinet is excessively low, static electricity is caused, and the device in the cabinet is damaged due to electrostatic discharge. In addition, fluctuation of the humidity in the cabinet causes a high-humidity or low-humidity alarm and even causes condensation in the cabinet.

In the conventional technology, an air conditioner is usually installed in a cabinet, and temperature is used as a parameter for controlling turning-on and turning off of the air conditioner. However, the cabinet is relatively sealed space. When the air conditioner is used to adjust temperature, humidity in the cabinet changes. After the air conditioner is turned on for a period of time, both the temperature and the humidity in the cabinet decrease. When the temperature decreases to a preset temperature, the air conditioner is turned off. In this adjustment manner, the air conditioner needs to be frequently turned on and turned off. This improves energy consumption; and also causes fluctuation of the humidity in the cabinet, and in a serious case, causes a high-humidity alarm and condensation of a device in the cabinet.

In addition, there is a method in which two types of devices that are an air conditioner and direct ventilation are installed in a cabinet to adjust temperature in the cabinet. When the temperature is relatively high, the temperature in the cabinet is adjusted by turning on the air conditioner and turning off the direct ventilation; or when the temperature is relatively low, the temperature in the cabinet is adjusted by turning off the air conditioner and turning on the direct ventilation. However, when the direct ventilation is turned off and the air conditioner is turned on, the temperature in the cabinet quickly increases; or when the air conditioner is turned off and the direct ventilation is turned on, humidity in the cabinet quickly increases. In addition, this case frequently happens in a process of adjusting the temperature in the cabinet. In this way, condensation is likely to be caused, and in a serious case, normal running of a device in the cabinet is affected.

To resolve the foregoing problem, embodiments provide a multi-temperature control cabinet, to resolve condensation caused due to fluctuation of humidity in the cabinet.

Embodiment 1

As shown in FIG. 1, this embodiment provides a multi-temperature control cabinet 10. The multi-temperature control cabinet 10 may include a cabinet body 11, one cabinet door 12, and a refrigerating system 13. The refrigerating system 13 includes one air conditioner 131, one direct ventilation unit 132, an air guide assembly 133 (shown in FIG. 2), and an environment monitoring apparatus (not shown in the figure). Both the air conditioner 131 and the direct ventilation unit 132 are disposed on the cabinet door 12, and the air conditioner 131 and the direct ventilation unit 132 are disposed in parallel in a height direction of the cabinet door 12. The environment monitoring apparatus is connected to both the air conditioner 131 and the direct ventilation unit 132, and the environment monitoring apparatus is configured to: monitor temperature and humidity in the cabinet body 11, and control turning-on and turning-off of the air conditioner 131 and the direct ventilation unit 132 based on the temperature and the humidity in the cabinet body 11.

In this embodiment, the environment monitoring apparatus is disposed to monitor the temperature and the humidity in the cabinet 10, and control the turning-on and the turning-off of the direct ventilation unit 132 and the air conditioner 131 based on the temperature and the humidity in the cabinet 10, to ensure that both the temperature and the humidity in the cabinet 10 are in a relatively stable state, so that fluctuation of the humidity in the cabinet 10 is effectively avoided and condensation in the cabinet 10 can be avoided, thereby ensuring normal running of a device in the cabinet 10.

In this embodiment, as shown in FIG. 1, there may be one cabinet door 12. In some examples, there may be a plurality of cabinet doors 12. One or more air conditioners 131 and one or more direct ventilation units 132 may be disposed on the cabinet door 12. In this embodiment, an example in which one air conditioner 131 and one direct ventilation unit 132 are disposed on the cabinet door 12 is used for description.

As shown in FIG. 1, the cabinet body 11 of the multi-temperature control cabinet 10 is of a cuboid cabinet-like structure. The cabinet door 12 is rotatably disposed on one side of the cabinet body 11, the cabinet door 12 can be opened and closed relative to the cabinet body 11, and when the cabinet door 12 is in a closed state, the cabinet body 11 and the cabinet door 12 form closed space. An installation component for installing electrical equipment and the electrical equipment is disposed inside the cabinet body 11 and a position of the installation component is not limited herein.

It should be noted that the environment monitoring apparatus may be installed on the cabinet body 11, may be installed on the cabinet door 12, or may be installed on the installation component in the cabinet body 11, provided that the environment monitoring apparatus can monitor the temperature and the humidity in the cabinet 10 and can control the turning-on and the turning-off of the air conditioner 131 and the direct ventilation unit 132.

It should be noted that the air conditioner 131 in this embodiment may be an integrated air conditioner. An air exhaust vent 1311 and an air return vent 1312 of the air conditioner 131 are disposed on the integrated air conditioner, and a side on which the air exhaust vent 1311 and the air return vent 1312 of the air conditioner 131 are disposed facing the inside of the cabinet body 11 to adjust the temperature inside the cabinet 10. A model of the integrated air conditioner is not limited herein, provided that the integrated air conditioner can conveniently adjust the temperature in the cabinet 10.

Figure 2:
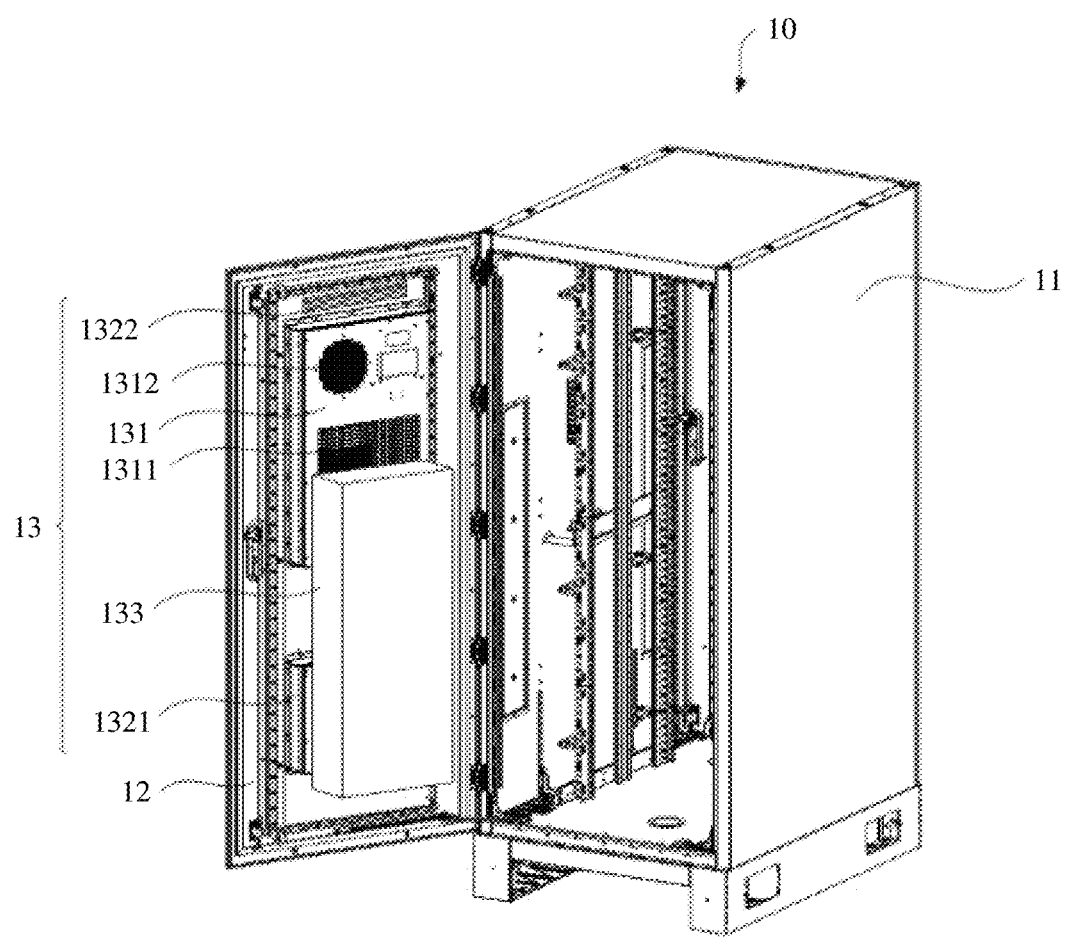
FIG. 2 is a schematic diagram of a structure of an open state of a cabinet door of a multi-temperature control cabinet according to an embodiment.

In a further embodiment, as shown in FIG. 1 and FIG. 2, the direct ventilation unit 132 includes an air intake unit 1321 and an air exhaust unit 1322. The air intake unit 1321 can suck natural air outside the cabinet 10 into the cabinet 10, and then the air is exhausted out of the cabinet 10 through the air exhaust unit 1322.

In this embodiment, the air intake unit 1321 is disposed below the air conditioner 131, and the air exhaust unit 1322 is disposed above the air conditioner 131. It should be noted that, because air rises due to thermal expansion, hot air is located above cold air in the cabinet 10. The disposing the air exhaust unit 1322 of the direct ventilation unit 132 above the air conditioner 131 helps exhaust the hot air in the cabinet 10 to the outside of the cabinet 10 through the air exhaust unit 1322, to implement exchange between air in the cabinet 10 and external air, thereby reducing the temperature in the cabinet 10 and balancing the humidity in the cabinet 10.

The air guide assembly 133 is disposed between the direct ventilation unit 132 and the air exhaust vent 1311 of the air conditioner 131. As shown in FIG. 2, the air guide assembly 133 is disposed between the air intake unit 1321 and the air exhaust vent 1311 of the air conditioner 131. The air guide assembly 133 may be configured to mix cold air exhausted from the air exhaust vent 1311 of the air conditioner 131 with natural air entering from the air intake unit 1321, to balance humidity of the cold air exhausted from the air exhaust vent 1311 of the air conditioner 131.

The air guide assembly 133 is disposed between the air intake unit 1321 and the air exhaust vent 1311 of the air conditioner 131, so that the cold air exhausted from the air exhaust vent 1311 of the air conditioner 131 can be mixed with the outdoor natural air entering from the air intake unit 1321 to adjust the humidity in the cabinet 10 when the temperature inside the cabinet 10 is adjusted, so that both the temperature and the humidity in the cabinet 10 are in a relatively stable state. This can ensure normal running of the device in the cabinet 10, can decrease the temperature in the cabinet 10, and can further prevent fluctuation of the humidity in the cabinet 10 to reduce a risk of condensation.

Figure 3:
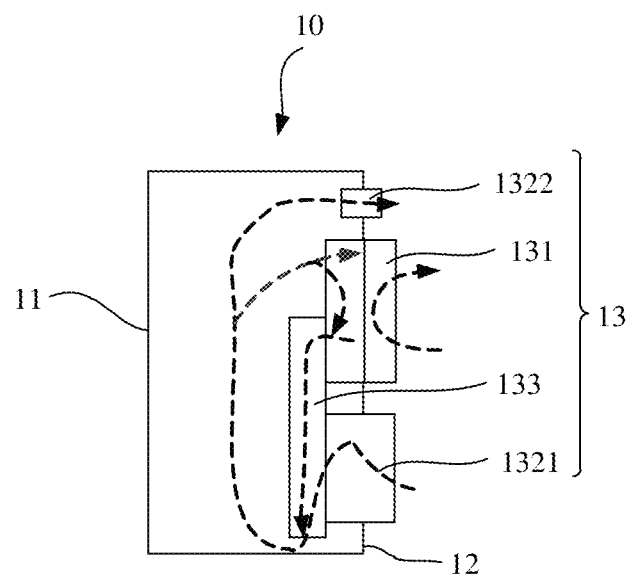
FIG. 3 is a schematic diagram of an air path of a multi-temperature control cabinet according to an embodiment.

In a further embodiment, as shown in FIG. 3, a dashed line with an arrow is used to represent a direction of an air path. During actual application, when determining, through monitoring, that the temperature inside the cabinet 10 is relatively high, the environment monitoring apparatus turns on the air conditioner 131 to perform refrigeration processing inside the cabinet 10. In this case, an air path of the air conditioner 131 includes an air path located inside the cabinet 10 and an air path located outside the cabinet 10. The air path located inside the cabinet 10 is as follows: Natural air is sucked from an air intake vent 1313 of the air conditioner 131, and under a refrigeration action of the air conditioner 131, cold air is exhausted into the cabinet 10 from the air exhaust vent 1311 of the air conditioner 131. A part of the cold air reaches a lower part of the cabinet 10 through the air guide assembly 133, and a part of the cold air is directly exhausted into the cabinet 10 from the air exhaust vent 1311 of the air conditioner 131. Because the cold air enters the cabinet 10, hot air in the cabinet 10 rises. Therefore, a part of the hot air enters the air conditioner 131 from the air return vent 1312 of the air conditioner 131, and then is exhausted, or enters a next cold cycle. The air path outside the cabinet 10 is as follows: Natural air is sucked from the air intake vent 1313 of the air conditioner 131, and the natural air is exhausted from an air exhaust vent 1314 outside the cabinet of the air conditioner 131 after passing through a heat exchanger of the air conditioner 131.

In a possible implementation, when the air conditioner 131 is in an on state, when determining, through monitoring, that humidity in the cabinet 10 is relatively low, the environment monitoring apparatus turns on the direct ventilation unit 132. In this case, air paths of the air conditioner 131 and the direct ventilation unit 132 are as follows: Natural air is sucked from both the air intake vent 1313 of the air conditioner 131 and the air intake unit 1321 of the direct ventilation unit 132. After natural air sucked by the air conditioner 131 is processed, cold air is exhausted from the air exhaust vent 1311 of the air conditioner 131. A part of the cold air reaches the lower part of the cabinet 10 through the air guide assembly 133. Natural air sucked by the air intake unit 1321 directly enters the air guide assembly 133. In this way, the cold air exhausted from the air exhaust vent 1311 of the air conditioner 131 is mixed, in the air guide assembly 133, with the natural air sucked by the air intake unit 1321, and then mixed air is exhausted into the cabinet 10. In this way, an air path of the air conditioner 131 is mixed with an air path of the direct ventilation unit 132, to mix air between the air path of the air conditioner 131 and the air path of the direct ventilation unit 132. Because humidity of the cold air exhausted from the air conditioner 131 is relatively low, and humidity of the natural air entering from the direct ventilation unit 132 is relatively high, after the mixing, humidity of the air exhausted into the cabinet 10 is relatively moderate, so that the humidity in the cabinet 10 is in a relatively moderate and relatively stable range. In this way, fluctuation of the humidity in the cabinet 10 can be prevented, to avoid condensation.

It may be understood that the humidity of the cold air exhausted from the air exhaust vent 1311 of the air conditioner 131 is relatively low, and the humidity of the outdoor natural air sucked by the air intake unit 1321 is higher than the humidity of the cold air exhausted from the air conditioner 131. Therefore, the cold air exhausted from the air exhaust vent 1311 of the air conditioner 131 is mixed with the outdoor natural air sucked by the air intake unit 1321, so that the humidity in the cabinet 10 can be increased, to keep the humidity inside the cabinet 10 within a moderate range. Therefore, neither of the following cases occurs: Static electricity is caused in the cabinet 10 due to excessively low humidity, causing a damage to the device in the cabinet; and the device in the cabinet cannot normally work due to excessively high temperature. In addition, a risk of condensation caused due to fluctuation of the humidity inside the cabinet 10 can be further reduced.

In addition, the turning-on and the turning-off of the air conditioner 131 and the direct ventilation unit 132 are controlled by using two indexes that are the temperature and the humidity, so that the humidity in the cabinet 10 can be adjusted when the temperature in the cabinet 10 is adjusted, and fluctuation of the humidity inside the cabinet 10 can also be prevented.

Figure 4:
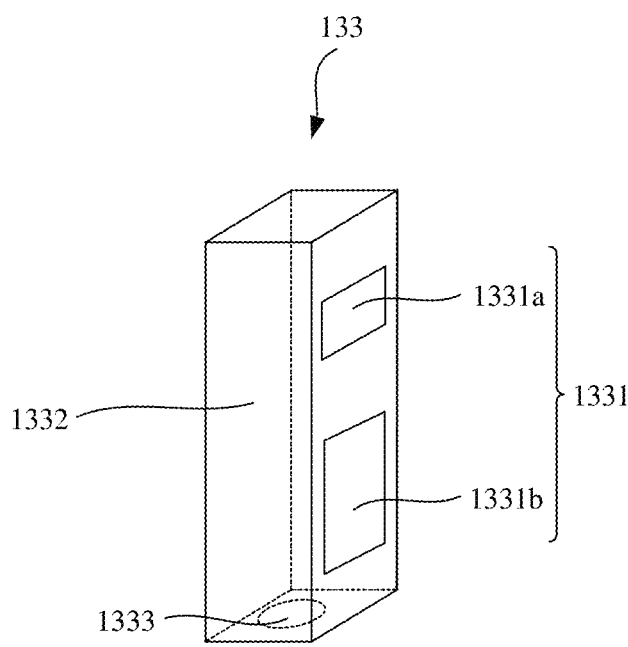
FIG. 4 is a schematic diagram of a structure of an air guide assembly of a multi-temperature control cabinet according to an embodiment.

In a further embodiment, as shown in FIG. 4, two air intake vents 1331, an air mixing channel 1332, and one mixed-air exhaust vent 1333 are disposed on the air guide assembly 133. The two air intake vents 1331 are a first air intake vent 1331a and a second air intake vent 1331b. The first air intake vents 1331a is connected to the air exhaust vent 1311 of the air conditioner 131 and the second air intake vent 1331b is connected to the air intake unit 1321.

The air guide assembly 133 in this embodiment is of a cuboid bucket-like structure. Both the first air intake vent 1331a and the second air intake vent 1331b are rectangular, and the mixed-air exhaust vent 1333 is circular. The first air intake vent 1331a and the second air intake vent 1331b are disposed on a same side of the air mixing channel 1332 and respectively correspond to the air exhaust vent 1311 of the air conditioner 131 and the air intake unit 1321 of the direct ventilation unit 132, and the mixed-air exhaust vent 1333 is disposed at a lower end of the air mixing channel 1332.

In a possible implementation, in this embodiment, as shown in FIG. 4, the first air intake vent 1331a and the second air intake vent 1331b are rectangular in different sizes. A size of the first air intake vent 1331a is relatively small, and provided that the first air intake vent 1331a partially overlaps the air exhaust vent 1311 of the air conditioner 131, a part of cold air blown out of the air conditioner 131 can be guided into the air mixing channel 1332. In this way, the cold air blown out of the air conditioner 131 can be divided into two parts. A part of the cold air is directly blown into the cabinet 10 to facilitate quick cooling, and the other part of the cold air enters the air mixing channel 1332 to be mixed with natural air entering from the direct ventilation unit 132, to prevent a sudden decrease in the humidity inside the cabinet.

In a possible implementation, a size of the second air intake vent 1331b is relatively large. In this way, more natural air can be guided into the air mixing channel 1332, so that humidity of air in the cabinet 10 can be quickly adjusted. The mixed-air exhaust vent 1333 is further disposed at the lower end of the air mixing channel 1332. The mixed-air exhaust vent 1333 may release mixed cold air with proper temperature and humidity into the cabinet 10, so that hot air inside the cabinet 10 rises, and then is exhausted out of the cabinet 10 from the air return vent 1312 of the air conditioner 131 and the air exhaust unit 1322 of the direct ventilation unit 132.

It should be noted that the first air intake vent 1331a and the second air intake vent 1331b may be in a same shape or different shapes, and the first air intake vent 1331a and the second air intake vent 1331b may be in a same size or different sizes. A shape and size may be set based on a case, provided that the first air intake vent 1331a and the second air intake vent 1331b respectively correspond to the air exhaust vent 1311 of the air conditioner 131 and the air intake unit 1321 of the direct ventilation unit 132.

It should be noted that, in the foregoing embodiment, the first air intake vent 1331a partially covers the air exhaust vent 1311 of the air conditioner 131. However, this does not constitute a limitation on protection scope. In some examples, the first air intake vent 1331a may alternatively cover the entire air exhaust vent 1311 of the air conditioner 131. In this way, all cold air exhausted from the air exhaust vent 1311 of the air conditioner 131 can enter the air mixing channel 1332 to be fully mixed with natural air entering from the direct ventilation unit 132, and then mixed air can enter the cabinet 10 through the mixed-air exhaust vent 1333. In this way, it can be ensured that all air entering the cabinet 10 is obtained after air mixing processing, so that the humidity in the cabinet 10 is more easily kept in a relatively stable state, to effectively alleviate condensation in the cabinet 10.

In addition, it should be noted that the second air intake vent 1331b may also partially cover the air intake unit 1321. In this way, air circulation in the cabinet 10 can be accelerated to cool the cabinet 10 more quickly.

Figure 5:
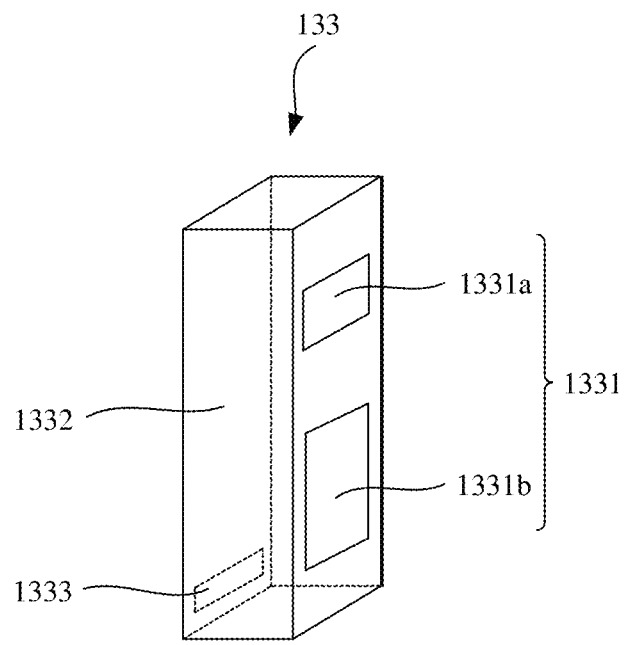
FIG. 5 is a schematic diagram of another structure of an air guide assembly of a multi-temperature control cabinet according to an embodiment.

In a possible implementation, in this embodiment, as shown in FIG. 5, a first air intake vent 1331a, a second air intake vent 1331b, an air mixing channel 1332, and a mixed-air exhaust vent 1333 are disposed on the air guide assembly 133. The air guide assembly 133 is of a cuboid bucket-like structure as a whole, both the first air intake vent 1331a and the second air intake vent 1331b are rectangular, and the mixed-air exhaust vent 1333 is also rectangular. The first air intake vent 1331a and the second air intake vent 1331b are disposed on a same side of the air mixing channel 1332, the first air intake vent 1331a corresponds to the air exhaust vent 1311 of the air conditioner 131, the second air intake vent 1331b corresponds to the air intake unit 1321 of the direct ventilation unit 132, and the mixed-air exhaust vent 1333 is disposed on a side that is of the air mixing channel 1332 and that faces the inside of the cabinet 10.

In a further embodiment, shapes of the air intake vents 1331 on the air guide assembly 133 are not limited to rectangles shown in FIG. 4 and FIG. 5. The air intake vents 1331 may be alternatively in other shapes, for example, circular or trapezoidal, provided that the air mixing channel 1332 is connected to both the air intake vents 1331 and the mixed-air exhaust vent 1333 and the air intake vents 1331 are respectively connected to the air exhaust vents 1311 of the air conditioner 131 and the air intake unit 1321.

In addition, a shape and a position of the mixed-air exhaust vent 1333 may be set based on a case. For example, the mixed-air exhaust vent 1333 may be of a circular structure and disposed at the lower end of the air mixing channel 1332, as shown in FIG. 4, or the mixed-air exhaust vent 1333 may be of a rectangular structure and disposed on the side that is of the air guide channel and that faces the inside of the cabinet 10, as shown in FIG. 5. A length and a shape of the air guide channel are not limited herein. Provided that there is an air guide channel and the cold air blown out of the air conditioner 131 can be mixed with natural air entering from the direct ventilation unit 132, this falls within the protection scope.

Figure 6:
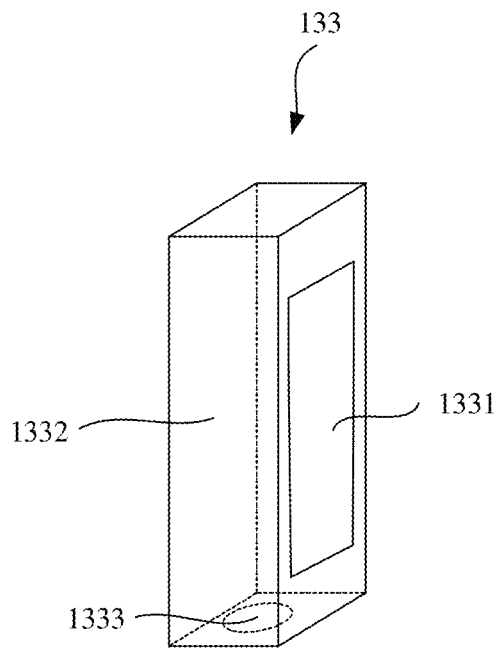
FIG. 6 is a schematic diagram of still another structure of an air guide assembly of a multi-temperature control cabinet according to an embodiment.

In a further embodiment, as shown in FIG. 6, one air intake vent 1331, an air mixing channel 1332, and one mixed-air exhaust vent 1333 are disposed on the air guide assembly 133. The air guide assembly 133 is of a cuboid bucket-like structure as a whole, the air intake vent 1331 is rectangular, and the mixed-air exhaust vent 1333 is also rectangular. The air intake vent 1331 is disposed on a side of the air mixing channel 1332 that faces the cabinet door 12, the air intake vent 1331 is connected to both the air exhaust vent 1311 of the air conditioner 131 and the air exhaust unit 1322, and the mixed-air exhaust vent 1333 is circular and is disposed at a lower end of the air mixing channel 1332.

In this embodiment, the air intake vent 1331 is disposed as a large rectangular structure, so that a structure of the air guide assembly 133 can be simplified, and mixing of the cold air blown out of the air conditioner 131 and the natural air entering from the direct ventilation unit 132 can be accelerated, to more quickly adjust the temperature and the humidity in the cabinet 10, thereby ensuring normal running of the device in the cabinet 10.

It should be noted that an overall shape of the air guide assembly 133 is not limited to the cuboid bucket-like structure, and alternatively, may be of a circular tubular structure or may be of another odd-form structure. Provided that an air mixing effect can be implemented, this falls within the protection scope.

In a further embodiment, a material of the air guide assembly 133 includes but is not limited to sheet metal or plastic and may be alternatively another material such as rubber.

It should be noted that a fastening manner of the air guide assembly 133 does not constitute a limitation on the protection scope, provided that the air guide assembly 133 can be fastened to the cabinet door 12.

In a further embodiment, the environment monitoring apparatus (not shown in the figure) may include a temperature monitoring component and a humidity monitoring component. The temperature monitoring part is configured to monitor the temperature in the cabinet body 11. The humidity monitoring unit is configured to monitor the humidity in the cabinet body 11.

Embodiment 2

Figure 7:
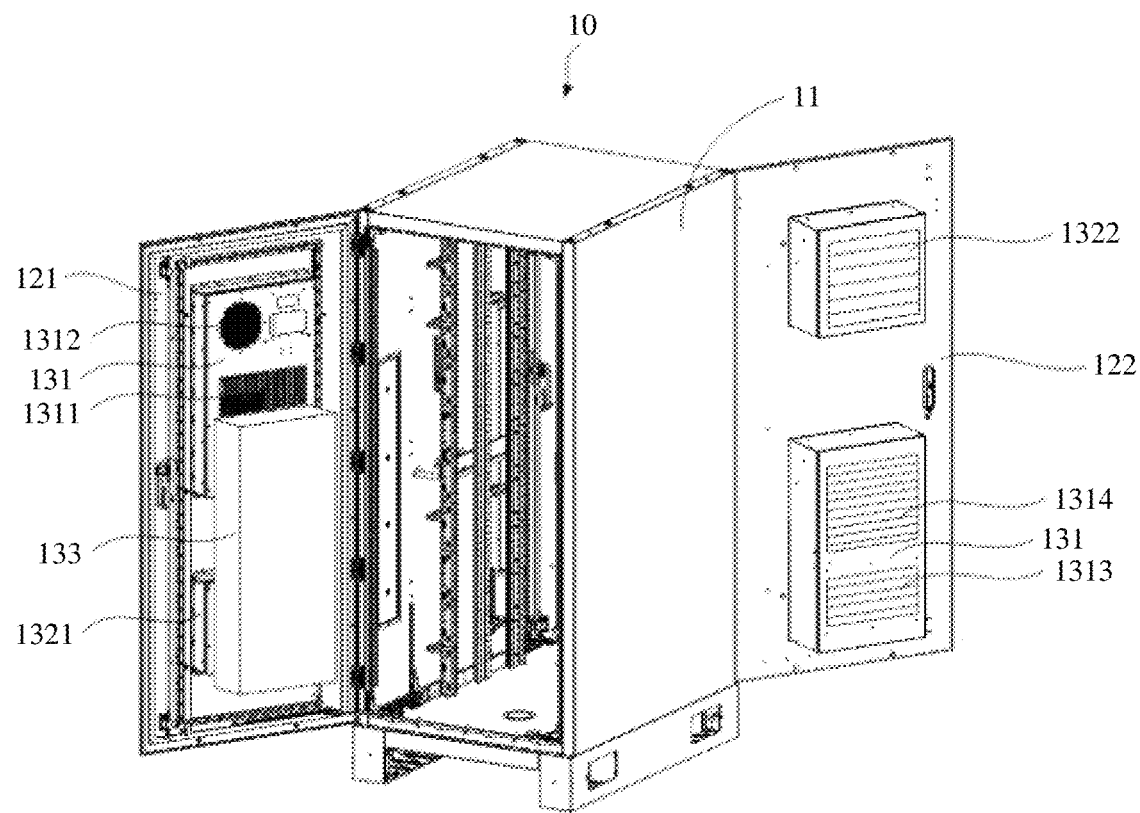
FIG. 7 is a schematic diagram of a structure of an open state of a cabinet door of a multi-temperature control cabinet according to another embodiment.

As shown in FIG. 7, different from Embodiment 1, a cabinet door 12 in this embodiment includes a first cabinet door 121 and a second cabinet door 122 that are oppositely disposed; one air conditioner 131 and an air intake unit 1321 are disposed on the first cabinet door 121, and the air intake unit 1321 is located below the air conditioner 131; one air conditioner 131 and an air exhaust unit 1322 are disposed on the second cabinet door 122, and the air exhaust unit 1322 is located above the air conditioner 131; and an air guide assembly 133 is disposed between an air exhaust vent 1311 of the air conditioner 131 and the air intake unit 1321 on the first cabinet door 121.

In this embodiment, the air conditioner 131 and the air intake unit 1321 are disposed on the first cabinet door 121, and the air conditioner 131 is located above the air intake unit 1321; and the air conditioner 131 and the air exhaust unit 1322 are disposed on the second cabinet door 122, and the air conditioner 131 is located below the air exhaust unit 1322. In this way, the air conditioners 131 on the two cabinet doors 12 are located at different heights, the air intake unit 1321 and the air exhaust unit 1322 are also located at different heights, and the two air conditioners 131, the air intake unit 1321, and the air exhaust unit 1322 are respectively located in four positions of a cabinet 10, so that convection is caused during refrigeration of the cabinet 10, to accelerate adjustment of temperature and humidity in the cabinet 10.

Figure 8:
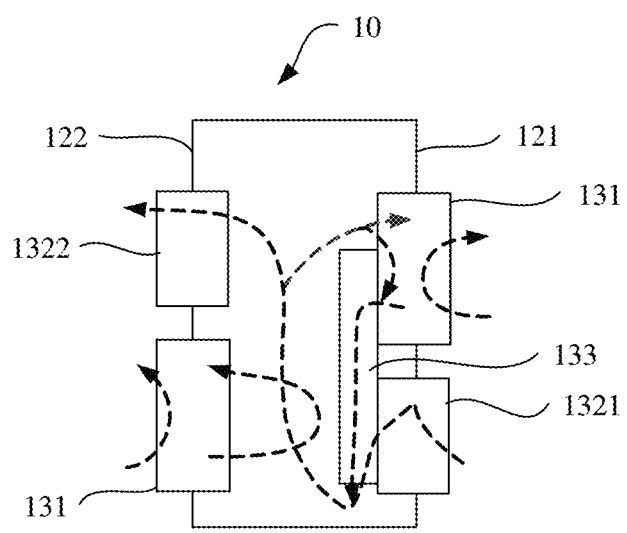
FIG. 8 is a schematic diagram of an air path of a multi-temperature control cabinet according to another embodiment.

As shown in FIG. 8, a dashed line with an arrow is used to represent a direction of an air path. During actual application, when determining, through monitoring, that the temperature inside the cabinet 10 is relatively high, an environment monitoring apparatus turns on the two air conditioners 131 to perform refrigeration processing inside the cabinet 10. In this case, an air path of the air conditioner 131 disposed on the first cabinet door 121 includes an air path located inside the cabinet 10 and an air path located outside the cabinet 10.

The air path located inside the cabinet 10 is as follows: Natural air is sucked from an air intake vent 1313 of the air conditioner 131, and under a refrigeration action of the air conditioner 131, cold air is exhausted into the cabinet 10 from the air exhaust vent 1311 of the air conditioner 131. A part of the cold air reaches a lower part of the cabinet 10 through the air guide assembly 133, a part of the cold air is directly exhausted into the cabinet 10 from the air exhaust vent 1311 of the air conditioner 131, and a part of the air in the cabinet 10 is exhausted through an air return vent 1312 of the air conditioner 131. An air path of the air conditioner 131 disposed on the second cabinet door 122 is as follows: Natural air is sucked from an air intake vent 1313 of the air conditioner 131, and under a refrigeration action of the air conditioner 131, cold air is exhausted into the cabinet 10 from an air exhaust vent 1311 of the air conditioner 131. A part of the air in the cabinet 10 is exhausted through an air return vent 1312 of the air conditioner 131. The air path outside the cabinet 10 is as follows: Natural air is sucked from the air intake vent 1313 of the air conditioner 131, and the natural air is exhausted from an air exhaust vent 1314 outside the cabinet of the air conditioner 131 after passing through a heat exchanger of the air conditioner 131.

As an explanation, inside the cabinet 10, because the air conditioner 131 on the first cabinet door 121 is disposed above the air intake unit 1321, the air conditioner 131 on the second cabinet door 122 is disposed below the air exhaust unit 1322, and the two cabinet doors 12 are oppositely disposed, during working, the two air conditioners 131 blow the cold air to each other in opposite directions. In this way, convection of the cabinet 10 is enhanced to accelerate air circulation in the cabinet 10, thereby accelerating refrigeration inside the cabinet 10.

In a possible implementation, when the air conditioners 131 are in an on state, when determining, through monitoring, that humidity in the cabinet 10 is relatively low, the environment monitoring apparatus turns on a direct ventilation unit 132. In this case, air paths of the air conditioners 131 and the direct ventilation unit 132 are as follows: Both the air intake vents 1313 of the two air conditioners 131 and the air intake unit 1321 of the direct ventilation unit 132 suck natural air. After the natural air sucked by the air conditioners 131 is processed, the cold air is exhausted from the air exhaust vents 1311 of the air conditioners 131. A part of the cold air generated by the air conditioner 131 located on the first cabinet door 121 reaches the lower part of the cabinet 10 through the air guide assembly 133, and the natural air sucked by the air intake unit 1321 directly enters the air guide assembly 133. In this way, the cold air exhausted from the air exhaust vent 1311 of the air conditioner 131 on the first cabinet door 121 is mixed, in the air guide assembly 133, with the natural air sucked by the air intake unit 1321, and then mixed air is exhausted into the cabinet 10 from a mixed-air exhaust vent 1333 of the air guide assembly 133. Cold air generated by the air conditioner 131 located on the second cabinet door 122 is directly exhausted into the cabinet 10 from the air exhaust vent 1311 of the air conditioner 131. Because both the air conditioner 131 on the second cabinet door 122 and the mixed-air exhaust vent 1333 of the air guide assembly 133 are located in the lower part of the cabinet 10, the air blown out of the air conditioner 131 on the second cabinet door 122 is mixed with the mixed air exhausted from the air guide assembly 133, and then a part of the air in the cabinet 10 is exhausted out of the cabinet 10 through the air return vent 1312 of the air conditioner 131 and the air exhaust unit 1322.

Humidity of the cold air exhausted from the air conditioner 131 is relatively low, and humidity of the natural air entering from the direct ventilation unit 132 is relatively high, and after the cold air blown out of the air conditioner 131 is mixed with the natural air, the humidity in the cabinet 10 is in a relatively moderate and relatively stable range. In this way, fluctuation of the humidity in the cabinet 10 can be prevented, to avoid condensation.

In some embodiments, to enhance an effect of the air mixing between the air conditioners 131 and the direct ventilation unit 132, an air guide assembly 133 may be further disposed between the air exhaust vent 1311 of the air conditioner 131 on the second cabinet door 122 and the air intake unit 1321. It should be noted that when the air guide assembly 133 is disposed between the air exhaust vent 1311 of the air conditioner 131 on the second cabinet door 122 and the air intake unit 1321, because the air intake unit 1321 is disposed on the first cabinet door, the air guide assembly 133 may be disposed on a lower part of the cabinet body in this case. In addition, when both the first cabinet door 121 and the second cabinet door 122 are in a closed state, a first air intake vent 1331a of the air guide assembly 133 exactly corresponds to the air exhaust vent 1311 of the air conditioner 131, and a second air intake vent 1331b of the air guide assembly 133 exactly corresponds to the air intake unit 1321. In this case, the first air intake vent 1331a and the second air intake vent 1331b may be disposed on two ends of the air guide assembly 133. In this way, when the two cabinet doors are closed, it can be ensured that the two air intake vents 1331 respectively correspond to the air conditioner 131 and the air intake unit 1321. In addition, a mixed-air exhaust vent 1333 may be disposed on a side that is of the air guide assembly 133 and that is close to the top of the cabinet 10. In this way, mixed air of the air conditioner 131 and the direct ventilation unit 132 can be blown into the cabinet 10.

It should be noted that in an example in which two air guide assemblies 133 are disposed, the two air guide assemblies 133 may be in a same shape or different shapes, provided that an air mixing effect can be implemented.

For the multi-temperature control cabinet 10 in the foregoing embodiment, an embodiment provides a scheduling method for a multi-temperature control cabinet 10. The method may include: an environment monitoring apparatus performs real-time monitoring on temperature and humidity in a cabinet body 11; and controls turning-on and turning-off of an air conditioner 131 and a direct ventilation unit 132 based on monitored temperature and humidity values.

It should be noted that the temperature in the cabinet 10 may include three cases. In a first case, the temperature in the cabinet is relatively high, for example, exceeds a first preset temperature threshold. In a second case, the temperature in the cabinet falls between the first preset temperature threshold and a second preset temperature threshold. In a third case, the temperature in the cabinet is lower than the second preset temperature threshold. For the first case and the second case, a refrigerating system 13 is usually used for adjustment. For the third case, no adjustment may be performed.

The following describes in detail a process of adjusting the temperature and the humidity in the cabinet when the temperature in the cabinet 10 is in the first case.

In a further embodiment, the controlling turning-on and turning-off of an air conditioner 131 and a direct ventilation unit 132 based on monitored temperature and humidity values may include: determining whether the temperature monitored by the environment monitoring apparatus is higher than the first preset temperature threshold; when the temperature monitored by the environment monitoring apparatus is higher than the first preset temperature threshold, turning on the air conditioner 131; when the air conditioner 131 is in a working state, determining whether humidity monitored by the environment monitoring apparatus is lower than a first preset humidity threshold; and when the humidity monitored by the environment monitoring apparatus is lower than the first preset humidity threshold, turning on the direct ventilation unit 132, so that the direct ventilation unit 132 and the air conditioner 131 increase the humidity in the cabinet in an air mixing manner.

In a possible implementation, after the turning on the direct ventilation unit 132, the method may further include: determining whether a difference between humidity monitored by the environment monitoring apparatus in a first preset time period is lower than a first preset difference; and when the difference between the humidity monitored by the environment monitoring apparatus in the first preset time period is lower than the first preset difference, turning off the direct ventilation unit 132.

In a possible implementation, after the turning on the direct ventilation unit 132, the method may further include: determining whether humidity monitored by the environment monitoring apparatus is higher than a second preset humidity threshold, where the first preset humidity threshold is smaller than the second preset humidity threshold; and when the humidity monitored by the environment monitoring apparatus is higher than the second preset humidity threshold, turning off the direct ventilation unit 132. In this case, the air conditioner 131 runs to adjust the temperature and the humidity inside the cabinet 10. In a possible implementation, after the turning off the direct ventilation unit 132, the method may further include: determining whether temperature monitored by the environment monitoring apparatus is lower than the second preset temperature threshold, where the second preset temperature threshold is lower than the first preset temperature threshold; and when the temperature monitored by the environment monitoring apparatus is lower than the second preset temperature threshold, turning off the air conditioner 131.

The following describes in detail the scheduling method for a multi-temperature control cabinet 10 with reference to FIG. 9 to FIG. 12. In FIG. 9 to FIG. 12, a preset temperature threshold is represented by T, the first preset temperature threshold is represented by T1, and the second preset temperature threshold is represented by T2; a preset humidity threshold is represented by RH, a first preset humidity threshold is represented by RH1, and a second preset humidity threshold is represented by RH2; and a preset difference is represented by a, the first preset difference is represented by a1, and a second preset difference is represented by a2. In this embodiment, both the first preset time period and a second preset time period are 30 minutes.

Figure 9:
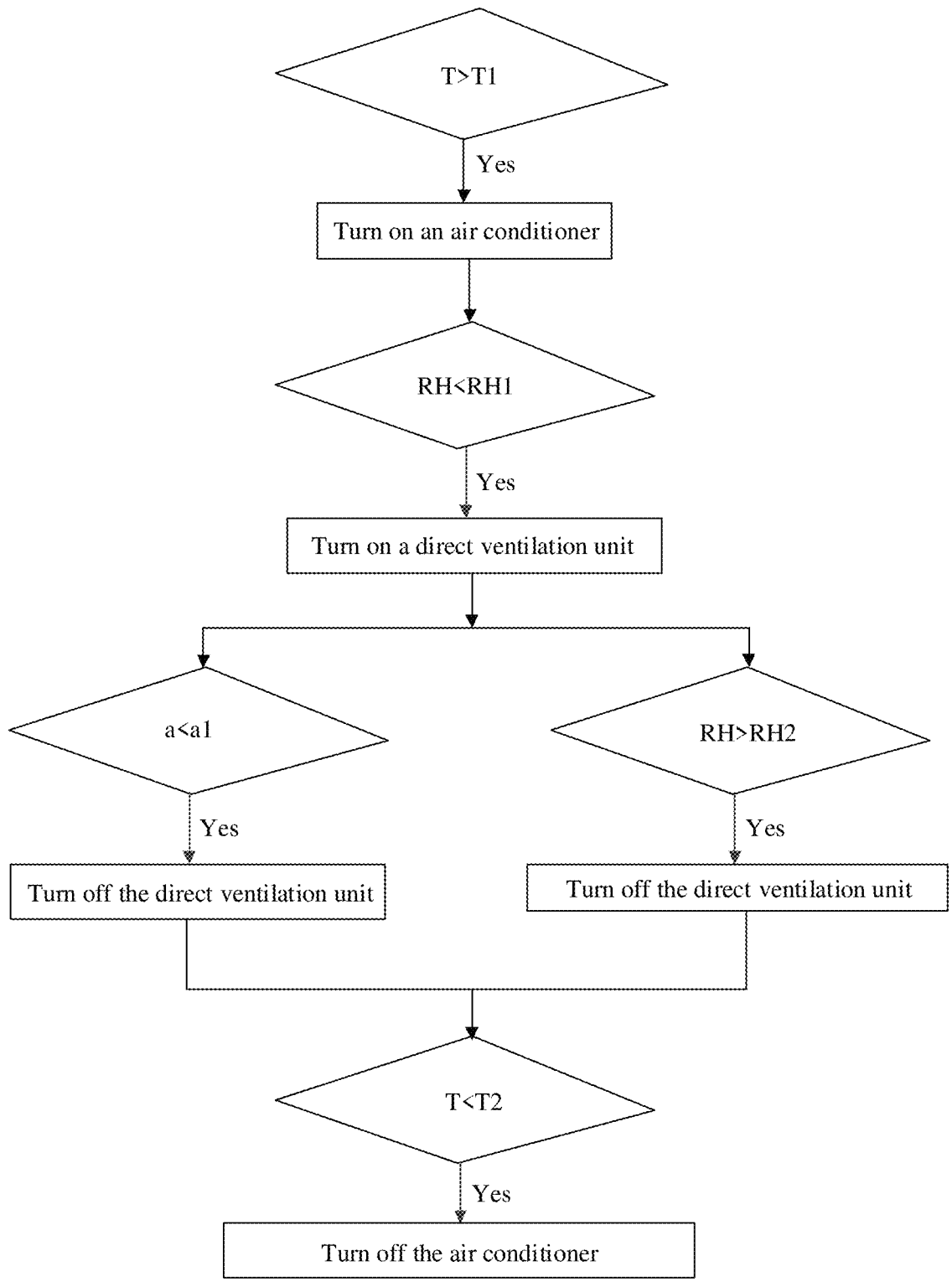
FIG. 9 is a working flowchart of an air scheduling method for a multi-temperature control cabinet according to an embodiment.

In a running process of the cabinet 10, as shown in FIG. 9, when determining, through monitoring, that temperature in the cabinet 10 is higher than T1, the environment monitoring apparatus turns on the air conditioner 131 to perform refrigeration; when humidity monitored by the monitoring apparatus is lower than RH1, the environment monitoring apparatus turns on the direct ventilation unit 132, so that the direct ventilation unit 132 and the air conditioner 131 increase the humidity in the cabinet in an air mixing manner; and after the air conditioner 131 and the direct ventilation unit 132 work for a period of time, the temperature in the cabinet 10 decreases and the humidity in the cabinet 10 increases, and when a difference between humidity monitored by the environment monitoring apparatus in 30 min is lower than a1, that is, humidity is in a stable state, the environment monitoring apparatus turns off the direct ventilation unit 132.

In a possible implementation, as shown in FIG. 9, when the direct ventilation unit 132 is in an on state, when humidity monitored by the environment monitoring apparatus is greater than RH2, the direct ventilation unit 132 is turned off. In this case, the air conditioner 131 runs to adjust the temperature and the humidity inside the cabinet 10.

In a possible implementation, after the direct ventilation unit 132 is turned off, when temperature monitored by the environment monitoring apparatus is lower than the second preset temperature threshold, the air conditioner 131 is turned off.

The following describes in detail a process of adjusting the temperature and the humidity in the cabinet when the temperature in the cabinet 10 is in the second case.

In a further embodiment, the controlling turning-on and turning-off of an air conditioner 131 and a direct ventilation unit 132 based on monitored temperature and humidity values may alternatively include: determining whether the temperature monitored by the environment monitoring apparatus is lower than the first preset temperature threshold and higher than the second preset temperature threshold; and when the temperature monitored by the environment monitoring apparatus is lower than the first preset temperature threshold and higher than the second preset temperature threshold, turning on the direct ventilation unit 132, to cool the inside of the cabinet 10 by using the direct ventilation unit 132.

In a possible implementation, after the turning on the direct ventilation unit 132, the method may further include: determining whether a difference between humidity monitored by the environment monitoring apparatus in the first preset time period is lower than the first preset difference; and when the difference between the humidity monitored by the environment monitoring apparatus in the first preset time period is lower than the first preset difference, turning off the direct ventilation unit 132.

In a possible implementation, after the turning on the direct ventilation unit 132, the method may further include: determining whether humidity monitored by the environment monitoring apparatus is higher than the second preset humidity threshold, where the first preset humidity threshold is smaller than the second preset humidity threshold; and when the humidity monitored by the environment monitoring apparatus is higher than the second preset humidity threshold, turning on an internal circulation fan of the air conditioner 131, to decrease the humidity in the cabinet in an air mixing manner by using the direct ventilation unit 132 and the air conditioner 131.

In a possible implementation, after the turning on an internal circulation fan of the air conditioner 131, the method may further include: determining whether a difference between humidity monitored by the environment monitoring apparatus in the second preset time period is lower than the second preset difference; and when the difference between the humidity monitored by the environment monitoring apparatus in the second preset time period is lower than the second preset difference, turning off the air conditioner 131.

Figure 10:
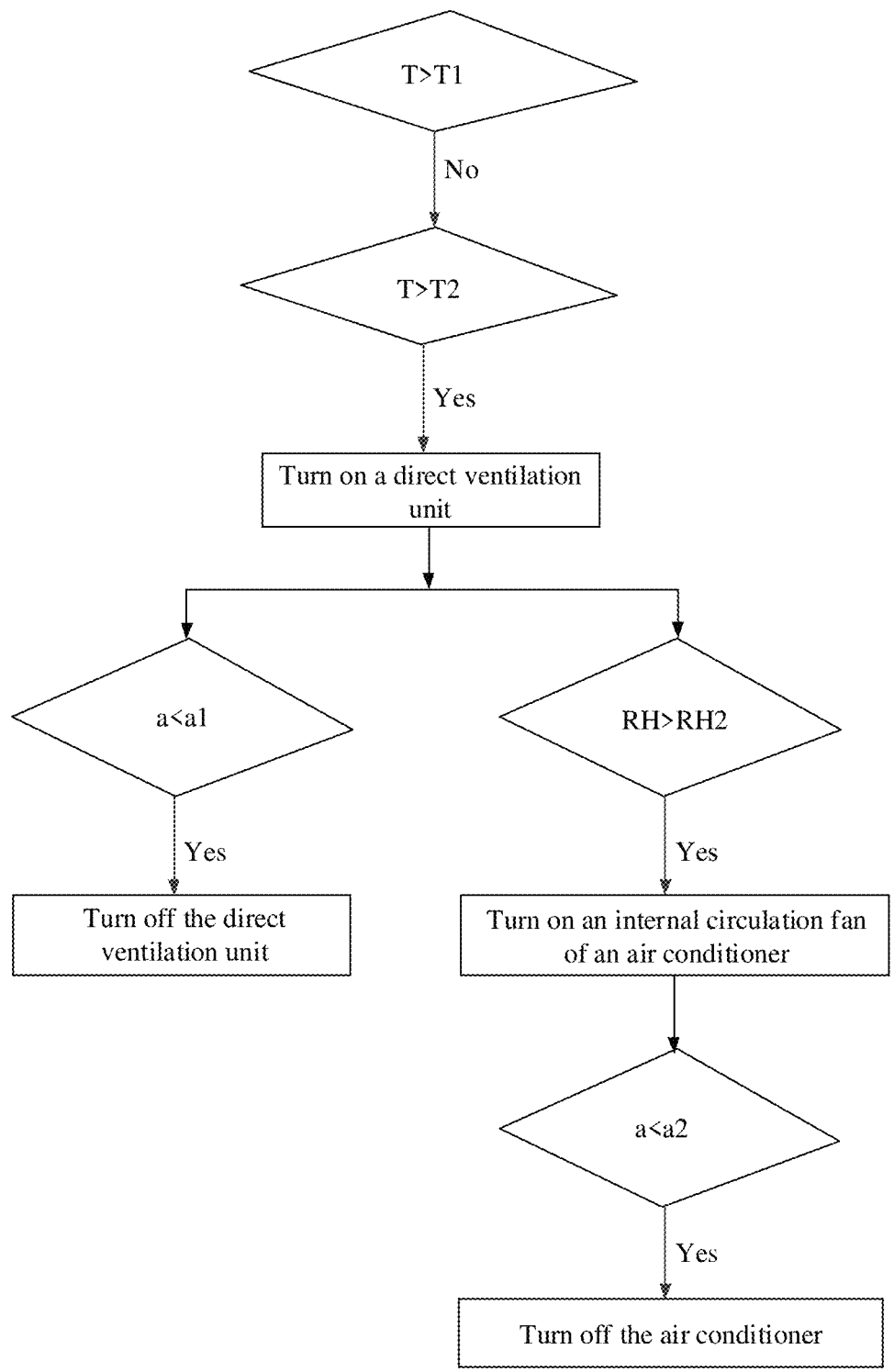
FIG. 10 is another working flowchart of an air scheduling method for a multi-temperature control cabinet according to an embodiment.

The following describes in detail the scheduling method for a multi-temperature control cabinet 10 with reference to FIG. 10.

As shown in FIG. 10, when determining, through monitoring, that temperature in the cabinet 10 is lower than T1 and higher than T2, the environment monitoring apparatus turns on the direct ventilation unit 132 to perform refrigeration; and after the direct ventilation unit 132 works for a period of time, the humidity in the cabinet 10 increases, and when a difference between humidity monitored by the environment monitoring apparatus in the first preset time period is lower than a1, that is, humidity is in a stable state, the environment monitoring apparatus turns off the direct ventilation unit 132.

In a possible implementation, as shown in FIG. 10, when the direct ventilation unit 132 is in an on state, when humidity monitored by the environment monitoring apparatus is greater than RH2, an internal circulation fan of the air conditioner 131 is turned on; and when a difference between humidity monitored by the environment monitoring apparatus in the second preset time period is lower than a2, that is, humidity is in a stable state, the air conditioner 131 is turned off.

As an explanation, the internal circulation fan of the air conditioner 131 is located inside the cabinet 10. By working, the internal circulation fan can enable air in the cabinet to be sequentially circulated, so that hot air in the cabinet 10 can be sequentially blown into the air conditioner 131 for heat exchange. In addition, humidity of the air is decreased due to the refrigeration of the air conditioner 131.

Figure 11:
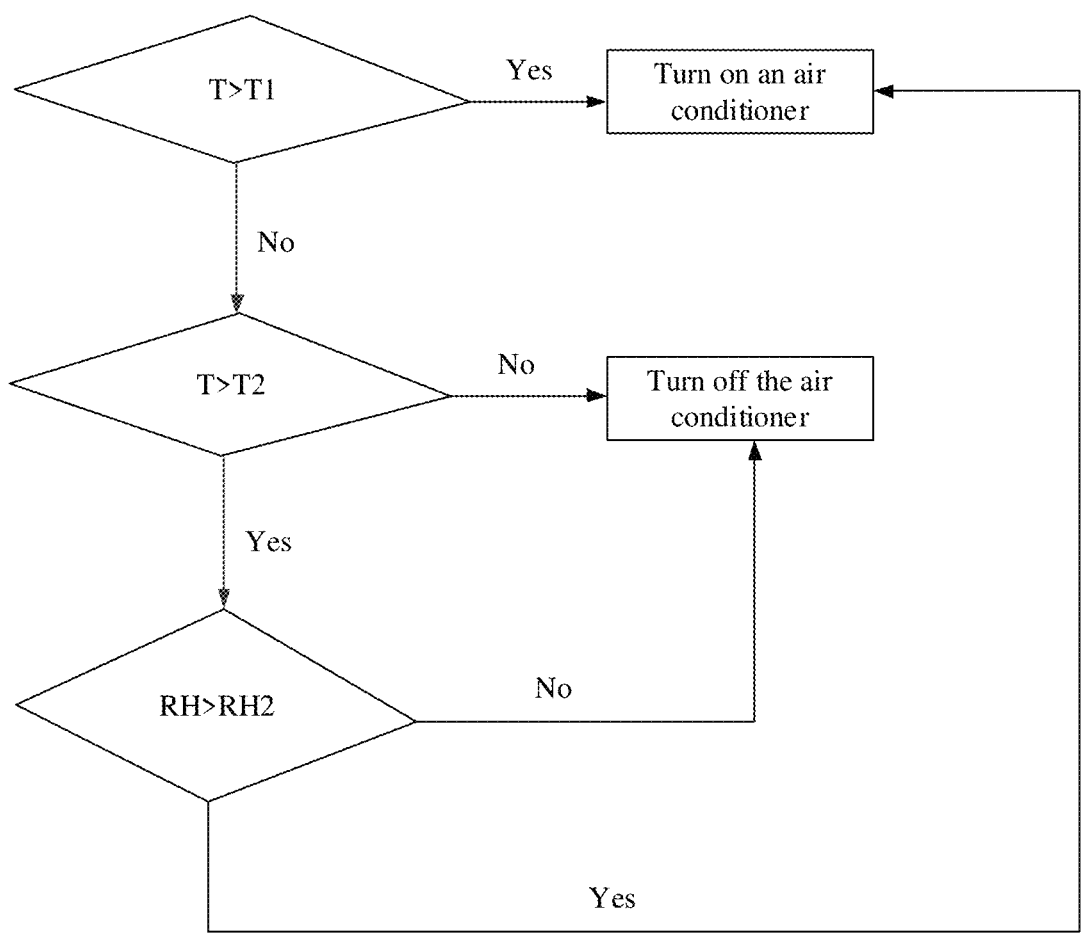
FIG. 11 is a working flowchart of an air conditioner in an air scheduling method for a multi-temperature control cabinet according to an embodiment.

It should be noted that the first preset time period may be the same as or may be different from the second preset time period. Correspondingly, the first preset difference may be the same as or may be different from the second preset difference. As shown in FIG. 11, when the temperature is higher than T1, or the temperature falls between T1 and T2 and the humidity is greater than RH2, the air conditioner 131 may be turned on; or when the temperature is not greater than T2, or the temperature falls between T1 and T2 and the humidity is not greater than RH2, the air conditioner 131 may be turned off.

Figure 12:
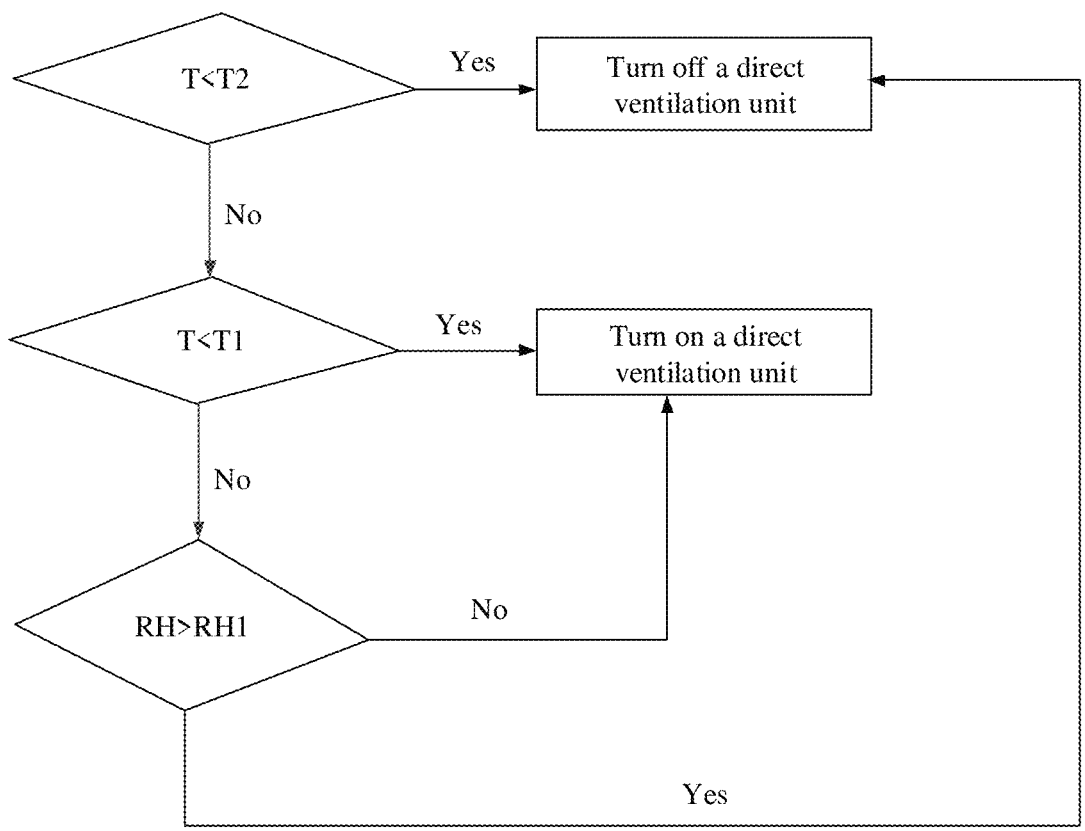
FIG. 12 is a working flowchart of a direct ventilation unit in an air scheduling method for a multi-temperature control cabinet according to an embodiment.

As shown in FIG. 12, when the temperature is smaller than T2, or the temperature is not smaller than T1 and the humidity is greater than RH1, the direct ventilation unit 132 may be turned off; or when the humidity is not greater than RH1, or the temperature falls between T1 and T2, the direct ventilation unit 132 may be turned on.

The turning-on and the turning-off of the air conditioner 131 and the direct ventilation unit 132 may be controlled by using two indexes that are the temperature and the humidity, so that the humidity in the cabinet 10 can be adjusted when the temperature in the cabinet 10 is adjusted, and fluctuation of the humidity inside the cabinet 10 can also be prevented, to avoid condensation inside the cabinet.

It should be noted that, in some embodiments, after the turning on the direct ventilation unit 132, the method may further include: determining whether temperature monitored by the environment monitoring apparatus is lower than the second temperature threshold, and determining whether a difference between humidity monitored by the environment monitoring apparatus in the first preset time period is lower than the first preset difference; when the temperature monitored by the environment monitoring apparatus is lower than the second temperature threshold, and the difference between the humidity monitored by the environment monitoring apparatus in the first preset time period is lower than the first preset difference, turning off the air conditioner 131, and also turning off the direct ventilation unit 132. In this case, the temperature and humidity in the cabinet 10 are in a proper state and do not need to be adjusted. In some embodiments, only the direct ventilation unit 132 may be turned on to adjust an internal environment of the cabinet 10, so that the internal environment of the cabinet 10 is kept in a proper state.

In addition, in a state in which both the direct ventilation unit 132 and the air conditioner 131 are turned off, or in a state in which only the direct ventilation unit 132 is turned on, when temperature monitored by the environment monitoring apparatus is higher than the first preset temperature threshold, the air conditioner 131 is turned on again, and the temperature and humidity in the cabinet 10 are adjusted according to the adjustment steps used when the temperature in the cabinet 10 is in the first case.

It may be understood that when the temperature inside the cabinet 10 is smaller than the second preset temperature threshold and the humidity falls between the first preset humidity threshold and the second preset humidity threshold, it indicates that the temperature and the humidity in the cabinet 10 are in a proper state, and the direct ventilation unit 132 and the air conditioner 131 do not need to work.

In the description, it should be noted that, unless otherwise specified or limited, terms such as "installation", "connected", and "connection" should be construed in a broad sense, for example, may be a fixed connection, may be an indirect connection by using an intermediate medium, or may be an internal connection between two elements or an interaction relationship between two elements. Persons of ordinary skill in the art may interpret meanings of the foregoing terms.

An apparatus or element or an implied apparatus or element needs to have a direction and be constructed and operated in a direction, and therefore cannot be construed as a limitation. In the description, "a plurality of" means two or more, unless otherwise specified.

Terms such as "first", "second", "third", and "fourth" in the specification, the claims, and the accompanying drawings are intended to distinguish between similar objects but do not necessarily indicate an order or sequence. It should be understood that the data termed in such a way are interchangeable in proper circumstances so that embodiments described herein can be implemented in orders except the order illustrated or described herein. In addition, the terms "include", "contain" and any other variants mean to cover the non-exclusive inclusion. For example, a process, method, system, product, or device that includes a list of steps or units is not necessarily limited to those steps or units but may include other steps or units not expressly listed or inherent to such a process, method, product, or device.

Finally, it should be noted that the foregoing embodiments are merely intended for describing solutions. Although described in detail with reference to the foregoing embodiments, persons of ordinary skill in the art should understand that they may still make modifications or make equivalent replacements without departing from the scope of the embodiments.

What is claimed is:

1. A multi-temperature control cabinet, comprising:
a cabinet body;
a cabinet door; and
a refrigerating system, wherein the refrigerating system comprises:
at least one air conditioner,
at least one direct ventilation unit, and
an environment monitoring apparatus, both the at least one air conditioner and the at least one direct ventilation unit are disposed on the cabinet door, the at least one air conditioner and the at least one direct ventilation unit are disposed in parallel in a height direction of the cabinet door;
wherein an air intake vent of the at least one air conditioner is configured to suck air from the cabinet body, an air exhaust vent of the at least one air conditioner is configured to exhaust cooled air into the cabinet body;
wherein the at least one direct ventilation unit comprises an air intake vent and an air exhaust vent, an air guide assembly is disposed between the air intake vent of the at least one direct ventilation unit and the air exhaust vent of the at least one air conditioner;
wherein the air guide assembly comprises an air intake vent, an air mixing channel, and a mixed-air exhaust vent, the air mixing channel is connected to both the air intake vent of the air guide assembly and the mixed-air exhaust vent, and the air intake vent of the air guide assembly is connected to both the air exhaust vent of the at least one air conditioner and the air intake vent of the at least one direct ventilation unit;
wherein the environment monitoring apparatus comprises a temperature sensor and a humidity sensor, the environment monitoring apparatus is connected to both the at least one air conditioner and the at least one direct ventilation unit, and the environment monitoring apparatus is configured to monitor temperature and humidity in the cabinet body, and control turning-on and turning-off of the at least one air conditioner and the at least one direct ventilation unit based on the temperature and the humidity in the cabinet body.

2. The multi-temperature control cabinet according to claim 1, wherein the air intake vent of the at least one direct ventilation unit is located below the at least one air conditioner, and the air exhaust vent of the at least one direct ventilation unit is disposed above the at least one air conditioner.

3. The multi-temperature control cabinet according to claim 1, wherein the cabinet door comprises a first cabinet door and a second cabinet door that are oppositely disposed, the at least one air conditioner comprises two air conditioners;
one air conditioner of the two air conditioners and the air intake vent of the at least one direct ventilation unit are disposed on the first cabinet door, and the air intake vent of the at least one direct ventilation unit is located below the one air conditioner, another air conditioner of the two air conditioners and the air exhaust vent of the at least one direct ventilation unit are disposed on the second cabinet door, the air exhaust vent of the at least one direct ventilation unit is located above the one air conditioner, and the air guide assembly is disposed between the air exhaust vent of the one air conditioner and the air intake vent of the at least one direct ventilation unit.

4. The multi-temperature control cabinet according to claim 1, wherein the air guide assembly is a barrel-like structure, the air intake vent of the air guide assembly comprises a first air intake vent and a second air intake vent, the first air intake vent is connected to the air exhaust vent of the at least one air conditioner; and the second air intake vent is connected to the air intake vent of the at least one direct ventilation unit.

5. The multi-temperature control cabinet according to claim 1, wherein a material of the air guide assembly is either sheet metal or plastic.

6. A scheduling method for a multi-temperature control cabinet, used to adjust temperature and humidity in a multi-temperature control cabinet, the multi-temperature control cabinet comprising a cabinet body, a cabinet door, and a refrigerating system, wherein the refrigerating system comprises at least one air conditioner, at least one direct ventilation unit, and an environment monitoring apparatus, both the at least one air conditioner and the at least one direct ventilation unit are disposed on the cabinet door, and the at least one air conditioner and the at least one direct ventilation unit are disposed in parallel in a height direction of the cabinet door, an air intake vent of the at least one air conditioner is configured to suck air from the cabinet body, an air exhaust vent of the at least one air conditioner is configured to exhaust cooled air into the cabinet body, the at least one direct ventilation unit comprises an air intake vent and an air exhaust vent, an air guide assembly is disposed between the air intake vent of the at least one direct ventilation unit and the air exhaust vent of the at least one air conditioner, the air guide assembly comprises an air intake vent, an air mixing channel, and a mixed-air exhaust vent, the air mixing channel is connected to both the air intake vent of the air guide assembly and the mixed-air exhaust vent, and the air intake vent of the air guide assembly is connected to both the air exhaust vent of the at least one air conditioner and the air intake vent of the at least one direct ventilation unit, the environment monitoring apparatus comprises a temperature sensor and a humidity sensor, and the environment monitoring apparatus is connected to both the at least one air conditioner and the at least one direct ventilation unit, wherein the method comprises:
   performing, by the environment monitoring apparatus, real-time monitoring on temperature and humidity in the cabinet body; and
   controlling turning-on and turning-off of the at least one air conditioner and the at least one direct ventilation unit based on monitored temperature and humidity values.

7. The scheduling method for the multi-temperature control cabinet according to claim 6, wherein the controlling turning-on and turning-off of the at least one air conditioner and the at least one direct ventilation unit based on the monitored temperature and humidity values further comprises:
   determining whether the temperature monitored by the environment monitoring apparatus is higher than a first preset temperature threshold;
   when the temperature monitored by the environment monitoring apparatus is higher than the first preset temperature threshold, turning on the at least one air conditioner;
   when the at least one air conditioner is in a working state, determining whether humidity monitored by the environment monitoring apparatus is lower than a first preset humidity threshold; and
   when the humidity monitored by the environment monitoring apparatus is lower than the first preset humidity threshold, turning on the at least one direct ventilation unit, so that the at least one direct ventilation unit and the at least one air conditioner increase the humidity in the cabinet in an air mixing manner.

8. The scheduling method for the multi-temperature control cabinet according to claim 6, wherein the controlling turning-on and turning-off of the at least one air conditioner and the at least one direct ventilation unit based on the monitored temperature and humidity values further comprises:
   determining whether the temperature monitored by the environment monitoring apparatus is lower than the first preset temperature threshold and higher than a second preset temperature threshold, wherein the second preset temperature threshold is lower than the first preset temperature threshold; and
   when the temperature monitored by the environment monitoring apparatus is lower than the first preset temperature threshold and higher than the second preset temperature threshold, turning on the at least one direct ventilation unit, to adjust air in the cabinet by using the at least one direct ventilation unit.

9. The scheduling method for the multi-temperature control cabinet according to claim 7, wherein after the turning on the at least one direct ventilation unit, the method further comprises:
   determining whether a difference between humidity monitored by the environment monitoring apparatus in a first preset time period is lower than a first preset difference; and
   when the difference between the humidity monitored by the environment monitoring apparatus in the first preset time period is lower than the first preset difference, turning off the at least one direct ventilation unit.

10. The scheduling method for the multi-temperature control cabinet according to claim 7, wherein after the turning on the at least one direct ventilation unit, the method further comprises:
   determining whether humidity monitored by the environment monitoring apparatus is higher than a second preset humidity threshold, wherein the first preset humidity threshold is smaller than the second preset humidity threshold; and
   when the humidity monitored by the environment monitoring apparatus is higher than the second preset humidity threshold, turning off the at least one direct ventilation unit to decrease the humidity in the cabinet through running of the at least one air conditioner.

11. The scheduling method for the multi-temperature control cabinet according to claim 10, wherein after the turning off the at least one direct ventilation unit, the method further comprises:
   determining whether a temperature monitored by the environment monitoring apparatus is lower than a second preset temperature threshold, wherein the second preset temperature threshold is lower than the first preset temperature threshold; and
   when the temperature monitored by the environment monitoring apparatus is lower than the second preset temperature threshold, turning off the at least one air conditioner.

12. The scheduling method for the multi-temperature control cabinet according to claim 8, wherein after the turning on the at least one direct ventilation unit, the method further comprises:
   determining whether humidity monitored by the environment monitoring apparatus is higher than a second preset humidity threshold, wherein the first preset humidity threshold is smaller than the second preset humidity threshold; and
   when the humidity monitored by the environment monitoring apparatus is higher than the second preset humidity threshold, turning on an internal circulation fan of the at least one air conditioner, to decrease the humidity in the cabinet in an air mixing manner by using the at least one direct ventilation unit and the at least one air conditioner.

13. The scheduling method for the multi-temperature control cabinet according to claim 12, wherein after the turning on the internal circulation fan of the at least one air conditioner, the method further comprises:

determining whether a difference between humidity monitored by the environment monitoring apparatus in a second preset time period is lower than a second preset difference; and when the difference between the humidity monitored by the environment monitoring apparatus in the second preset time period is lower than the second preset difference, turning off the at least one air conditioner.

\* \* \* \* \*